(12) United States Patent
Yamaoka

(10) Patent No.: US 7,304,595 B2
(45) Date of Patent: Dec. 4, 2007

(54) CURRENT OUTPUT CIRCUIT

(75) Inventor: Yuusuke Yamaoka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/491,032

(22) Filed: Jul. 24, 2006

(65) Prior Publication Data

US 2007/0057831 A1    Mar. 15, 2007

(30) Foreign Application Priority Data

Aug. 29, 2005    (JP)    ............................ 2005-247479

(51) Int. Cl.
*H03M 1/66* (2006.01)
(52) U.S. Cl. ...................................................... 341/144
(58) Field of Classification Search ................ 341/144, 341/150; 327/365, 368, 538, 379
See application file for complete search history.

(56) References Cited

U.S. PATENT DOCUMENTS

| | | | | |
|---|---|---|---|---|
| 5,424,656 A | * | 6/1995 | Gibson et al. | ................. 326/63 |
| 6,087,885 A | | 7/2000 | Tobita | ......................... 327/379 |
| 6,628,146 B2 | * | 9/2003 | Tam | ............................. 327/63 |
| 6,646,895 B1 | * | 11/2003 | Jacobs et al. | ............. 363/21.08 |
| 6,717,468 B1 | * | 4/2004 | Jeong et al. | ................. 330/253 |
| 6,958,651 B2 | * | 10/2005 | Kimura | ....................... 330/253 |

FOREIGN PATENT DOCUMENTS

JP    2004-271646    9/2004

* cited by examiner

*Primary Examiner*—Peguy JeanPierre
(74) *Attorney, Agent, or Firm*—McDermott Will & Emery LLP

(57) ABSTRACT

A capacitor having a capacitance value corresponding to the size of an output current generating transistor is connected between the gate terminal of the output current generating transistor and the input terminal of an inverter circuit.

20 Claims, 5 Drawing Sheets

CURRENT OUTPUT CIRCUIT

CROSS-REFERENCE TO RELATED APPLICATION

The disclosure of Japanese Patent Application No. 2005-247479 filed on Aug. 29, 2005 including specification, drawings and claims is incorporated herein by reference in its entirety.

BACKGROUND OF THE INVENTION

The present invention relates to current output circuits capable of being used as semiconductor laser drivers and the like which are required to output a large current and operate at high speed.

A current output circuit with switch function, which includes an output current generating transistor and a switching transistor, conventionally has a problem in that potential at the drain or source of the output current generating transistor greatly varies when switching is performed.

Such great variations in the drain or source potential cause the gate potential of the output current generating transistor to be varied, if a parasitic capacitance exists between the drain and gate or the source and gate of the output current generating transistor. This produces a problem in that the value of the current output from the current output circuit varies from an intended value.

Japanese Laid-Open Publication No. 2004-271646 discloses means for suppressing such variations in output current value. Specifically, the following three methods (1) to (3) are used to prevent an output current value from deviating from a desired value: (1) the size of a transistor in a bias voltage generating circuit for generating a bias voltage, which is supplied to the gate of the output current generating transistor, is increased; (2) a switching transistor, which operates in a complementary manner, is additionally provided so as to make a current continuously pass through the output current generating transistor; and (3) the transconductance of the output current generating transistor is lowered so that the sensitivity of the output current value to variations in the gate potential is reduced.

SUMMARY OF THE INVENTION

However, the methods described above require a significant increase in current consumption and circuit area and thus are not substantially applicable to current output circuits which are required to output a large current and operate at high speed.

In view of the above, the present invention was made and it is therefore an object of the present invention to provide a current output circuit capable of outputting a large current and operating at high speed without causing a significant increase in current consumption and circuit area.

Specifically, an inventive current output circuit includes: an output current generating transistor having a gate terminal to which a bias voltage is supplied; an inverter circuit to which a switching signal is input; a switching transistor having a gate terminal connected with an output terminal of the inverter circuit, a source terminal connected with a drain terminal of the output current generating transistor, and a drain terminal from which current is output; and a capacitor connected between the gate terminal of the output current generating transistor and an input terminal of the inverter circuit.

As described, according to the present invention, variation in the bias voltage occurring due to the capacitor and variation in the bias voltage occurring due to the parasitic capacitance between the drain and gate or the source and gate of the output current generating transistor cancel each other out, so that the current output circuit can output current having a desired current value.

If the inventive circuit further includes a cascode transistor having a gate terminal to which predetermined bias voltage is supplied and current is output through the cascode transistor, the current output circuit can output current having a more accurate current value.

If, in the inventive circuit, the output voltage of a replica circuit is supplied through a buffer circuit, which is a source follower, to a gate terminal of a replica output current generating transistor included in the replica circuit so that gate voltage at that gate terminal becomes equal to the bias voltage, the impedance at the node that generates the bias voltage is lowered, which is advantageous in realizing a higher-current output and higher-speed operation current output circuit.

Since capacitance value of the capacitor is set to a value corresponding to the amount of parasitic capacitance at the gate terminal of the output current generating transistor, the bias voltage is set to a specified value with high speed, which is advantageous in realizing a high-current output and high-speed operation current output circuit.

If, in a digital-to-analog converter including a unit current cell, the unit current cell is formed of the inventive current output circuit, such structure becomes advantageous in realizing high-current output and high-speed operation.

Since the bias voltage is supplied as a common bias voltage to all of the gate terminals of the output current generating transistors, an inventive digital-to-analog converter can be used as a digital-to-analog converter that outputs highly accurate current, while operating at low speed.

If the bias voltage is individually supplied bit by bit, the inventive digital-to-analog converter can be used as a digital-to-analog converter that outputs highly accurate current, while operating at high speed.

If the inventive current output circuit or digital-to-analog converter is used as a current-to-light converter driving circuit for supplying current to a current-to-light converter, it is possible to drive the current-to-light converter with high-current output and high speed.

DETAILED DESCRIPTION OF THE INVENTION

Hereinafter, preferred embodiments of the present invention will be described in detail with reference to the accompanying drawings. The descriptions in the following preferred embodiments being essentially exemplary only, it will be understood that these descriptions are not intended to be limiting of the invention and the application thereof and the manner of applying it.

First Embodiment

Figure 1:
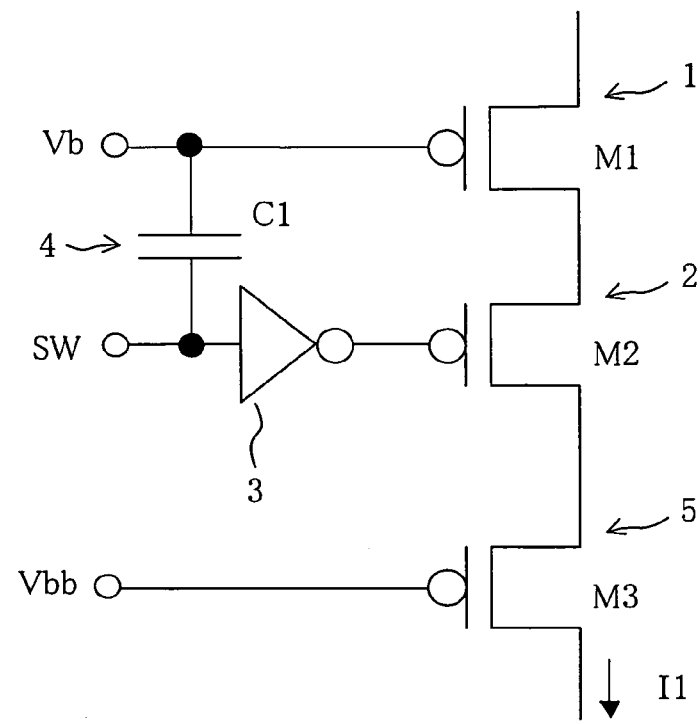
FIG. 1 illustrates the structure of a current output circuit according to a first embodiment of the present invention.

FIG. 1 illustrates the structure of a current output circuit according to a first embodiment of the present invention. As shown in FIG. 1, the current output circuit includes an output current generating transistor 1, a switching transistor 2, an inverter circuit 3, a capacitor 4, and a cascode transistor 5.

A bias voltage Vb is supplied to the gate terminal of the output current generating transistor 1, and the drain terminal thereof is connected with the source terminal of the switching transistor 2.

The gate terminal of the switching transistor 2 is connected with the output terminal of the inverter circuit 3, and the drain terminal of the switching transistor 2 is connected with the source terminal of the cascode transistor 5.

A switching signal SW is supplied to the input terminal of the inverter circuit 3.

The capacitor 4 is connected between the gate terminal of the output current generating transistor 1 and the input terminal of the inverter circuit 3, and the capacitance value of the capacitor 4 is set to a value corresponding to the amount of parasitic capacitance at the gate terminal of the output current generating transistor 1.

A bias voltage Vbb is supplied to the gate terminal of the cascode transistor 5 and a current I1 is output from the drain terminal thereof.

This structure allows variation in the bias voltage Vb occurring due to the capacitor 4 and variation in the bias voltage Vb occurring due to the parasitic capacitance between the drain and gate of the output current generating transistor 1 to cancel each other out, so that the current output circuit can output current having a desired current value. Simulation results obtained when switching operation was performed are described below.

Figure 7:
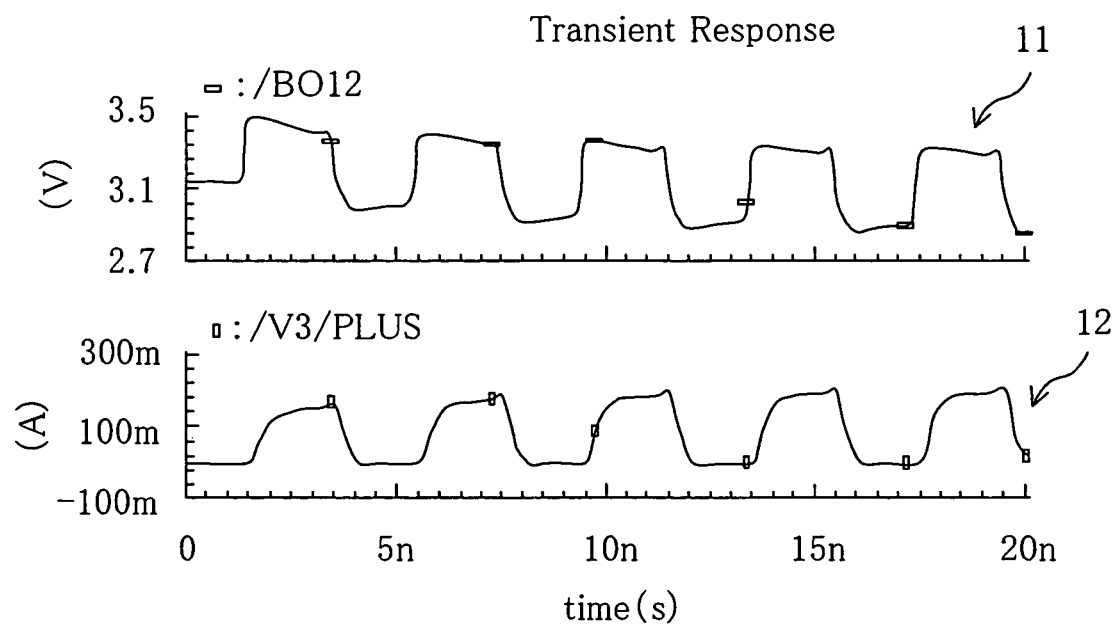
FIG. 7 illustrates a bias voltage waveform and an output current waveform in a conventional current output circuit.
Figure 8:
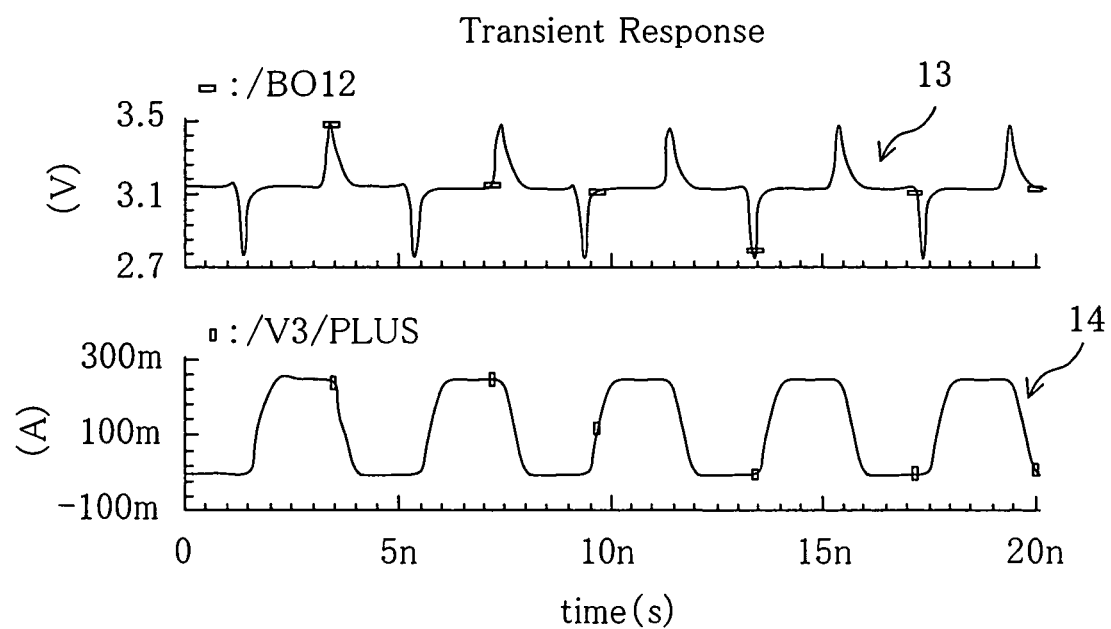
FIG. 8 illustrates a bias voltage waveform and an output current waveform in the current output circuit according to the first embodiment of the present invention.

FIG. 7 shows simulation results of a bias voltage waveform 11 and an output current waveform 12 in a conventional current output circuit. FIG. 8 shows simulation results of a bias voltage waveform 13 and an output current waveform 14 in the current output circuit according to the first embodiment of the present invention.

As can be seen from FIG. 7, in the conventional current output circuit, the bias voltage varied to deviate from a specified value, such that a sufficient amount of current was not output. In contrast, as can be seen from FIG. 8, in the current output circuit according to the first embodiment, the bias voltage instantaneously went back to a specified value to thereby allow a sufficient amount of current to be output.

As described above, in the current output circuit according to the first embodiment, the bias voltage Vb is set to the specified value with high speed, which is advantageous in realizing a high-current output and high-speed operation current output circuit.

Second Embodiment

Figure 2:
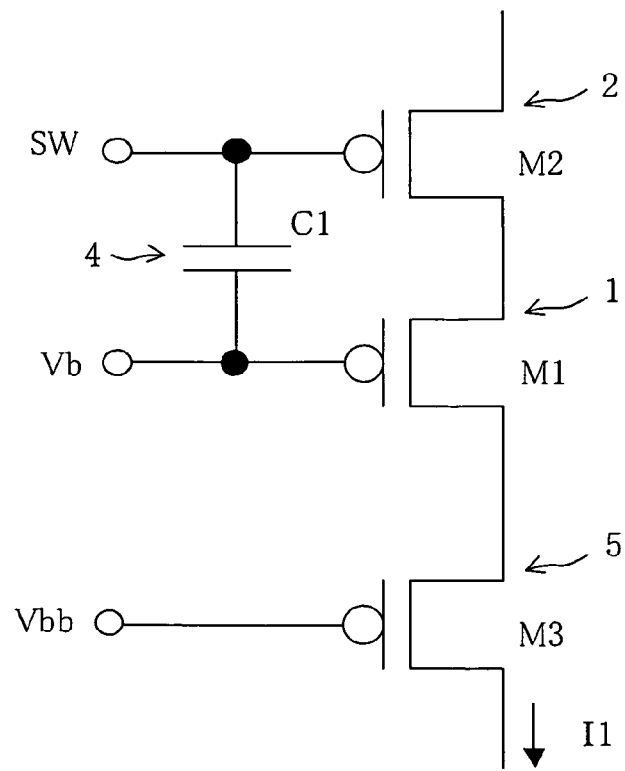
FIG. 2 illustrates the structure of a current output circuit according to a second embodiment of the present invention.

FIG. 2 illustrates the structure of a current output circuit according to a second embodiment of the present invention. As shown in FIG. 2, the current output circuit includes an output current generating transistor 1, a switching transistor 2, a capacitor 4, and a cascode transistor 5.

A switching signal SW is supplied to the gate terminal of the switching transistor 2, and the drain terminal thereof is connected with the source terminal of the output current generating transistor 1.

A bias voltage Vb is supplied to the gate terminal of the output current generating transistor 1, and the drain terminal thereof is connected with the source terminal of the cascode transistor 5.

The capacitor 4 is connected between the gate terminal of the output current generating transistor 1 and the gate terminal of the switching transistor 2, and the capacitance value of the capacitor 4 is set to a value corresponding to the amount of parasitic capacitance at the gate terminal of the output current generating transistor 1.

A bias voltage Vbb is supplied to the gate terminal of the cascode transistor 5 and a current I1 is output from the drain terminal thereof.

This structure allows variation in the bias voltage Vb occurring due to the capacitor 4 and variation in the bias voltage Vb occurring due to the parasitic capacitance between the source and gate of the output current generating transistor 1 to cancel each other out, so that the current output circuit can output current having a desired current value.

Third Embodiment

Figure 3:
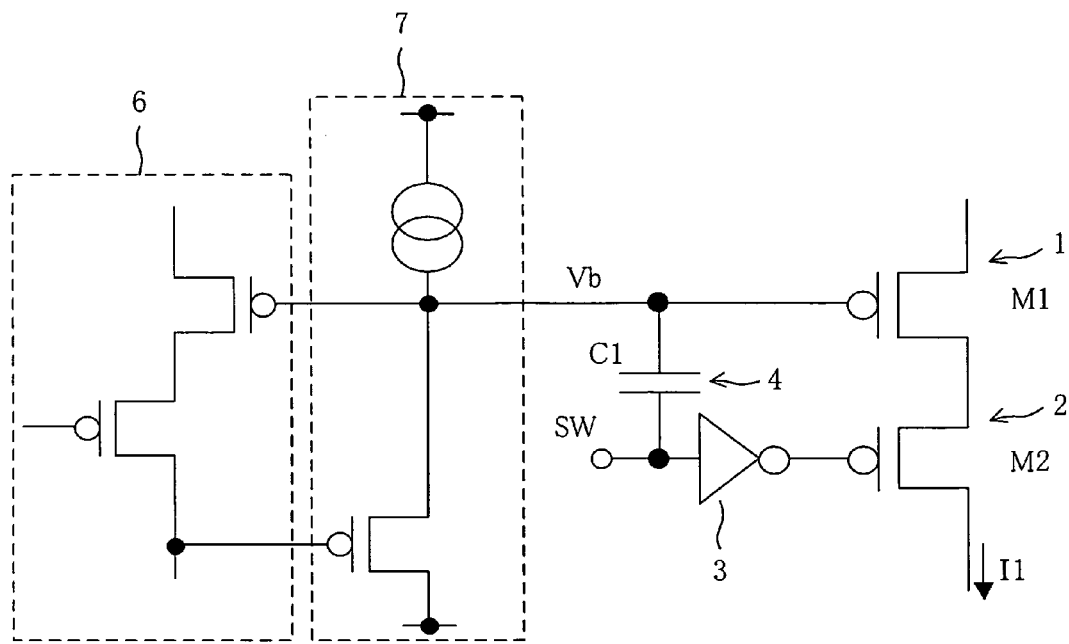
FIG. 3 illustrates the structure of a current output circuit according to a third embodiment of the present invention.

FIG. 3 illustrates the structure of a current output circuit according to a third embodiment of the present invention. As shown in FIG. 3, the current output circuit includes an output current generating transistor 1, a switching transistor 2, an inverter circuit 3, a capacitor 4, a replica circuit 6, and a source follower circuit 7 (a buffer circuit).

A bias voltage Vb output from the source follower circuit 7 is supplied to the gate terminal of the output current generating transistor 1, and the drain terminal of the output current generating transistor 1 is connected with the source terminal of the switching transistor 2.

The gate terminal of the switching transistor 2 is connected with the output terminal of the inverter circuit 3, and a current I1 is output from the drain terminal of the switching transistor 2.

A switching signal SW is supplied to the input terminal of the inverter circuit 3.

The capacitor 4 is connected between the gate terminal of the output current generating transistor 1 and the input terminal of the inverter circuit 3, and the capacitance value of the capacitor 4 is set to a value corresponding to the amount of parasitic capacitance at the gate terminal of the output current generating transistor 1.

The replica circuit 6 includes a replica of the output current generating transistor 1 and a replica of the switching transistor 2, and the output voltage of the replica circuit 6 is input into the source follower circuit 7.

The source follower circuit 7 is structured so as to output, as the bias voltage Vb, the voltage input from the replica circuit 6 to the gate terminal of the output current generating transistor 1 and also to output that input voltage to the gate terminal of the replica of the output current generating transistor 1 in the replica circuit 6.

By this structure, impedance at the gate terminal of the output current generating transistor 1 is lowered, which is advantageous in realizing a higher-current output and higher-speed operation current output circuit.

Fourth Embodiment

Figure 4:
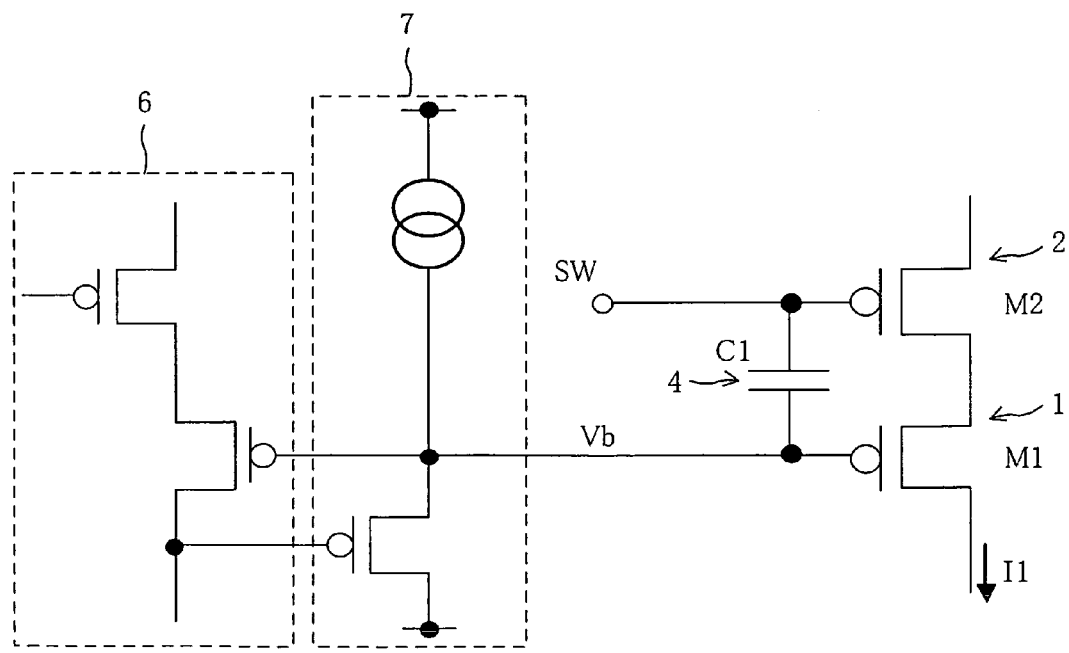
FIG. 4 illustrates the structure of a current output circuit according to a fourth embodiment of the present invention.

FIG. 4 illustrates the structure of a current output circuit according to a fourth embodiment of the present invention. As shown in FIG. 4, the current output circuit includes an output current generating transistor 1, a switching transistor 2, a capacitor 4, a replica circuit 6, and a source follower circuit 7 (a buffer circuit).

A switching signal SW is supplied to the gate terminal of the switching transistor 2, and the drain terminal thereof is connected with the source terminal of the output current generating transistor 1.

A bias voltage Vb output from the source follower circuit 7 is supplied to the gate terminal of the output current generating transistor 1, and a current I1 is output from the drain terminal thereof.

The capacitor 4 is connected between the gate terminal of the output current generating transistor 1 and the gate terminal of the switching transistor 2, and the capacitance value of the capacitor 4 is set to a value corresponding to the amount of parasitic capacitance at the gate terminal of the output current generating transistor 1.

The replica circuit 6 includes a replica of the output current generating transistor 1 and a replica of the switching transistor 2, and the output voltage of the replica circuit 6 is input into the source follower circuit 7.

The source follower circuit 7 is structured so as to output, as the bias voltage Vb, the voltage input from the replica circuit 6 to the gate terminal of the output current generating transistor 1 and also to output that input voltage to the gate terminal of the replica of the output current generating transistor 1 in the replica circuit 6.

By this structure, impedance at the gate terminal of the output current generating transistor 1 is lowered, which is advantageous in realizing a higher-current output and higher-speed operation current output circuit.

Fifth Embodiment

Figure 5:
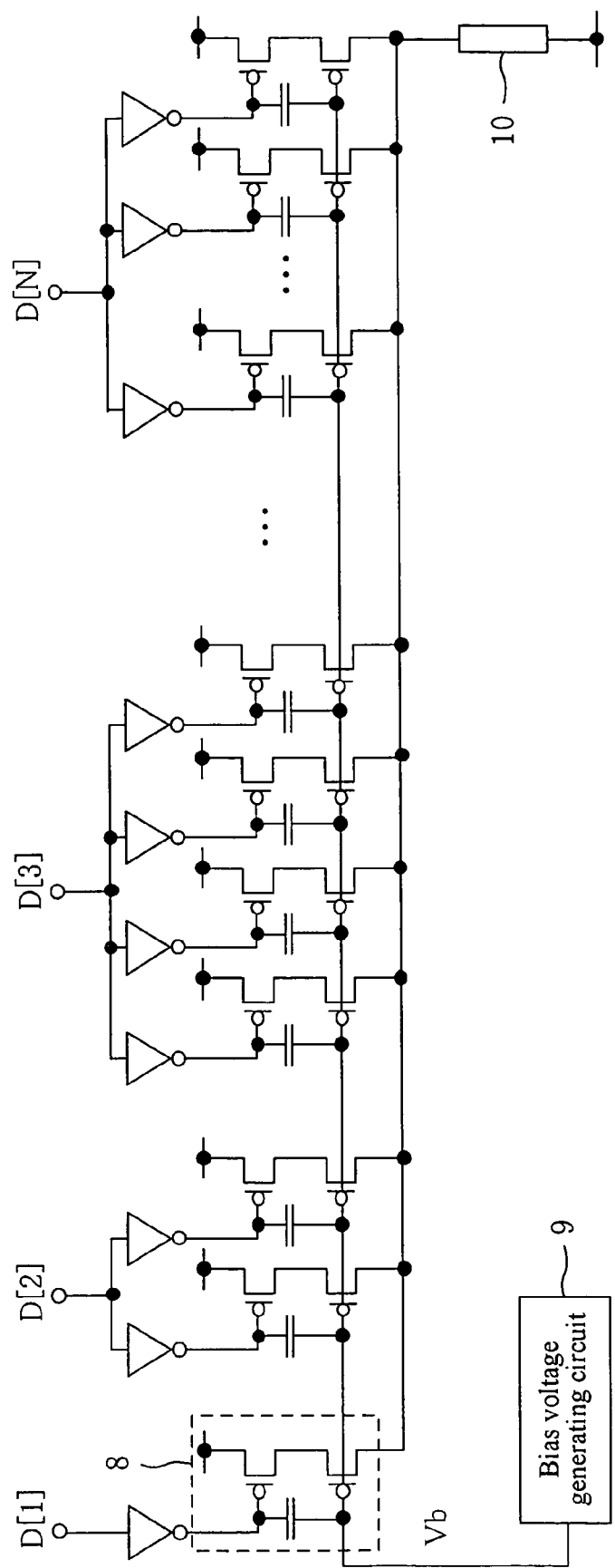
FIG. 5 illustrates the structure of a digital-to-analog converter according to a fifth embodiment of the present invention.

FIG. 5 illustrates the structure of a digital-to-analog converter according to a fifth embodiment of the present invention. As shown in FIG. 5, the digital-to-analog converter includes a plurality of current output circuits 8 according to the second embodiment as unit current cells. And a common bias voltage Vb is supplied from a bias voltage generating circuit 9 to the gate terminals of the respective output current generating transistors in the unit current cells.

Also, each of the unit current cells outputs output current to a load 10 (e.g., a current-to-light converter).

This structure allows the digital-to-analog converter of this embodiment to be used as a digital-to-analog converter that outputs highly accurate current, while operating at low speed.

Although in the fifth embodiment the current output circuits according to the second embodiment are used as the unit current cells, the present invention is not limited to this, and current output circuits according to the first embodiment may be used.

Sixth Embodiment

Figure 6:
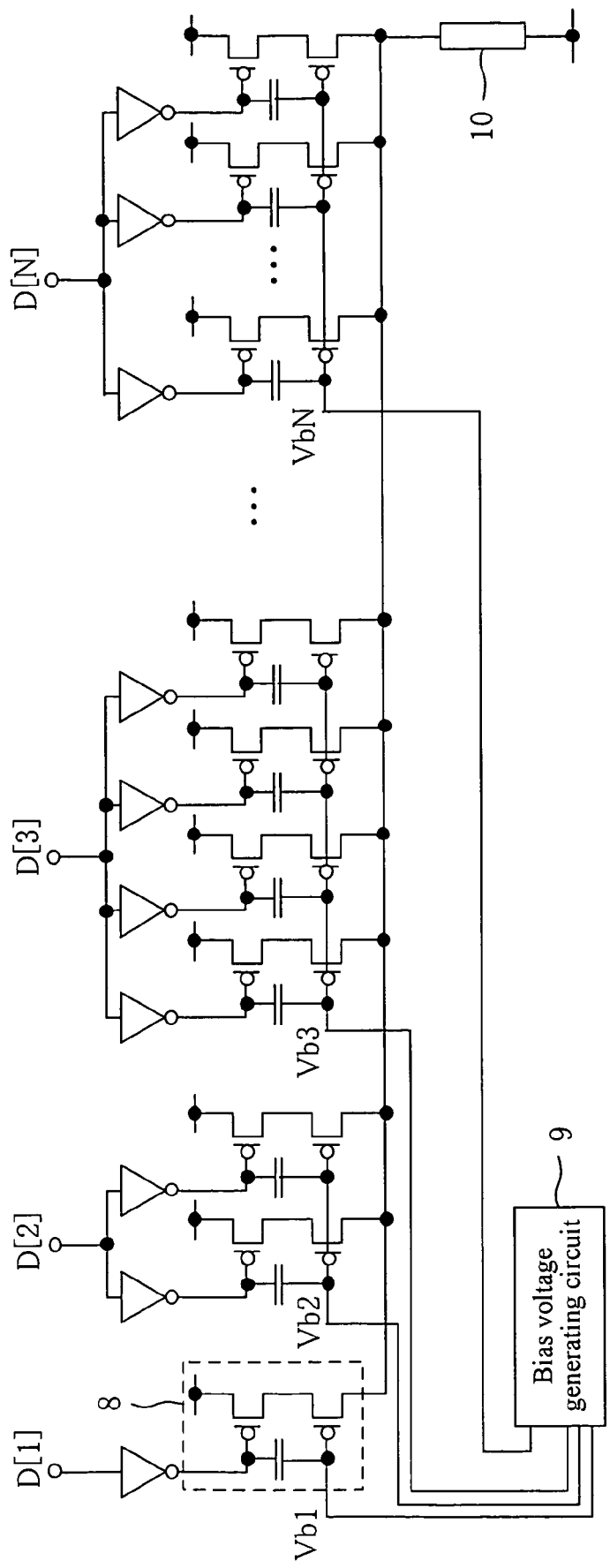
FIG. 6 illustrates the structure of a digital-to-analog converter according to a sixth embodiment of the present invention.

FIG. 6 illustrates the structure of a digital-to-analog converter according to a sixth embodiment of the present invention. As shown in FIG. 6, the digital-to-analog converter includes a plurality of current output circuits 8 according to the second embodiment as unit current cells. And from a bias voltage generating circuit 9, individual bias voltages Vb1, Vb2, and VbN, are respectively supplied bit by bit to the gate terminals of the output current generating transistors in the unit current cells.

Also, each of the unit current cells outputs output current to a load 10 (e.g., a current-to-light converter).

This structure allows the digital-to-analog converter of this embodiment to be used as a digital-to-analog converter that outputs highly accurate current, while operating at high speed.

Although in the sixth embodiment the current output circuits according to the second embodiment are used as the unit current cells, the present invention is not limited to this, and current output circuits according to the first embodiment may be used.

As described above, the current output circuits according to the present invention produce the highly practical effect that high-current output and high-speed operation are possible, and are thus very effective and have wide industrial applicability. The inventive current output circuits are usable particularly as semiconductor laser drivers for optical disks and the like.

What is claimed is:

1. A current output circuit comprising:
   an output current generating transistor having a gate terminal to which a bias voltage is supplied;
   an inverter circuit to which a switching signal is input;
   a switching transistor having a gate terminal connected with an output terminal of the inverter circuit, a source terminal connected with a drain terminal of the output current generating transistor, and a drain terminal from which current is output; and
   a capacitor connected between the gate terminal of the output current generating transistor and an input terminal of the inverter circuit.

2. The circuit of claim 1, further comprising a cascode transistor having a gate terminal to which predetermined bias voltage is supplied, a source terminal connected with the drain terminal of the switching transistor, and a drain terminal from which current is output.

3. The circuit of claim 1, further comprising a replica circuit including at least a replica of the output current generating transistor; and
   a buffer circuit into which output voltage of the replica circuit is input,
   wherein the output voltage of the replica circuit is supplied through the buffer circuit to a gate terminal of the replica output current generating transistor in the replica circuit so that gate voltage at that gate terminal becomes equal to the bias voltage.

4. The circuit of claim 3, wherein the buffer circuit is a source follower.

5. The circuit of claim 1, wherein capacitance value of the capacitor is set to a value corresponding to the amount of parasitic capacitance at the gate terminal of the output current generating transistor.

6. A digital-to-analog converter, comprising a unit current cell including the current output circuit of claim 1.

7. The converter of claim 6, wherein a plurality of said unit current cells are provided; and the bias voltage is supplied as a common bias voltage to the gate terminals of the respective output current generating transistors in the unit current cells.

8. The converter of claim 6, wherein a plurality of said unit current cells are provided; and the bias voltage is supplied bit by bit as an individual bias voltage to each of the gate terminals of the respective output current generating transistors in the unit current cells.

9. A circuit for driving a current-to-light converter, the circuit comprising the digital-to-analog converter of claim 6, wherein current is supplied from the digital-to-analog converter to the current-to-light converter.

10. A circuit for driving a current-to-light converter, the circuit comprising the current output circuit of claim 1, wherein current is supplied from the current output circuit to the current-to-light converter.

11. A current output circuit comprising:

an output current generating transistor having a gate terminal to which bias voltage is supplied and a drain terminal from which current is output;

a switching transistor having a gate terminal into which a switching signal is input and a drain terminal connected with a source terminal of the output current generating transistor; and a capacitor connected between the gate terminal of the output current generating transistor and the gate terminal of the switching transistor.

12. The circuit of claim 11, further comprising a cascode transistor having a gate terminal to which predetermined bias voltage is supplied, a source terminal connected with the drain terminal of the output current generating transistor, and a drain terminal from which current is output.

13. The circuit of claim 11, further comprising a replica circuit including at least a replica of the output current generating transistor; and a buffer circuit into which output voltage of the replica circuit is input, wherein the output voltage of the replica circuit is supplied through the buffer circuit to a gate terminal of the replica output current generating transistor in the replica circuit so that gate voltage at that gate terminal becomes equal to the bias voltage.

14. The circuit of claim 13, wherein the buffer circuit is a source follower.

15. The circuit of claim 11, wherein capacitance value of the capacitor is set to a value corresponding to the amount of parasitic capacitance at the gate terminal of the output current generating transistor.

16. A digital-to-analog converter, comprising a unit current cell including the current output circuit of claim 11.

17. The converter of claim 16, wherein a plurality of said unit current cells are provided; and the bias voltage is supplied as a common bias voltage to the gate terminals of the respective output current generating transistors in the unit current cells.

18. The converter of claim 16, wherein a plurality of said unit current cells are provided; and the bias voltage is supplied bit by bit as an individual bias voltage to each of the gate terminals of the respective output current generating transistors in the unit current cells.

19. A circuit for driving a current-to-light converter, the circuit comprising the digital-to-analog converter of claim 16, wherein current is supplied from the digital-to-analog converter to the current-to-light converter.

20. A circuit for driving a current-to-light converter, the circuit comprising the current output circuit of claim 11, wherein current is supplied from the current output circuit to the current-to-light converter.

* * * * *